(12) United States Patent
Yamazaki et al.

(10) Patent No.: US 7,932,664 B2
(45) Date of Patent: Apr. 26, 2011

(54) FLEXURAL VIBRATION PIECE

(75) Inventors: Takashi Yamazaki, Shiojiri (JP);
Makoto Furuhata, Matsumoto (JP)

(73) Assignees: Epson Toyocom Corporation (JP);
Seiko Epson Corporation (JP)

( * ) Notice: Subject to any disclaimer, the term of this patent is extended or adjusted under 35 U.S.C. 154(b) by 0 days.

(21) Appl. No.: 12/767,851

(22) Filed: Apr. 27, 2010

(65) Prior Publication Data

US 2010/0277041 A1 Nov. 4, 2010

(30) Foreign Application Priority Data

Apr. 30, 2009 (JP) ................................. 2009-111256

(51) Int. Cl.
*H01L 41/08* (2006.01)
*H03H 9/21* (2006.01)
(52) U.S. Cl. ....................................................... 310/370
(58) Field of Classification Search .................... 310/370
See application file for complete search history.

(56) References Cited

U.S. PATENT DOCUMENTS

| | | | | |
|---|---|---|---|---|
| 4,384,232 | A * | 5/1983 | Debely | 310/370 |
| 6,897,737 | B2 * | 5/2005 | Sakata et al. | 331/156 |
| 7,015,630 | B2 * | 3/2006 | Tanaya | 310/370 |
| 7,168,319 | B2 * | 1/2007 | Dalla Piazza et al. | 73/504.16 |
| 7,851,980 | B2 * | 12/2010 | Kizaki | 310/370 |
| 2007/0227333 | A1 * | 10/2007 | Higuchi et al. | 84/266 |
| 2007/0240511 | A1 * | 10/2007 | Higuchi et al. | 73/514.34 |
| 2009/0158566 | A1 * | 6/2009 | Hagelin et al. | 29/25.35 |
| 2010/0207495 | A1 * | 8/2010 | Kikushima et al. | 310/370 |
| 2010/0277041 | A1 * | 11/2010 | Yamazaki et al. | 310/367 |

FOREIGN PATENT DOCUMENTS

| | | |
|---|---|---|
| JP | 02-032229 | 2/1990 |
| JP | 06112760 A * | 4/1994 |
| JP | 2002-261575 | 9/2002 |
| JP | 2004135052 A * | 4/2004 |
| JP | 2004-260718 | 9/2004 |
| JP | 2004248237 A * | 9/2004 |
| JP | 2006060727 A * | 3/2006 |

(Continued)

OTHER PUBLICATIONS

C. Zener et al., "Internal Friction in Solids I. Theory of Internal Friction in Reeds", Physical Preview, vol. 52, pp. 230-235 (Aug. 1, 1937).

(Continued)

*Primary Examiner* — J. SanMartin
(74) *Attorney, Agent, or Firm* — Harness, Dickey & Pierce, P.L.C.

(57) ABSTRACT

A resonator includes a base portion and a vibration arm. The vibration arm has first and second main faces opposite each other, the main faces have first and second grooves, the first groove has a plurality of first groove portions which are divided in the longitudinal direction of the vibration arm and arranged to be alternately shifted on both sides with respect to the longitudinal center line of the vibration arm, the second groove has a plurality of second groove portions arranged similar to the first groove portions on an opposite side to the first groove portions with respect to the longitudinal center line. A voltage is applied to excitation electrodes provided at the first and second grooves and second excitation electrodes provided on both side faces of the vibration arm, such that the vibration arm flexural-vibrates in the in-plane direction of the first or second main face.

6 Claims, 10 Drawing Sheets

FOREIGN PATENT DOCUMENTS

JP  2006270335 A  * 10/2006
WO  WO 00-44092  7/2000

OTHER PUBLICATIONS

C. Zener et al., "Internal Friction in Solids II. General Theory of Thermoelastic Internal Friction", Physical Preview, vol. 53, pp. 90-99 (Jan. 1, 1938).

C. Zener et al., "Internal Friction in Solids III. Experimental Demonstration of Thermoelastic Internal Friction", Physical Preview, vol. 53, pp. 100-101 (Jan. 1, 1938).

Hideaki Itoh et al., "Analysis of Q-value of a quartz-crystal tuning-fork using thermoelastic equations" $36^{th}$ EM Symposium, pp. 5-8 (May 17, 2007).

Hideaki Itoh et al., "Analysis of Q-Value of Quartz Crystal Tuning Fork Using Thermoelastic Coupling Equations" Japanese Journal of Applied Physics 48 (2009).

Terry V. Roszhart, "The effect of thermoelastic internal friction on the Q of micromachined silicon resonators", Solid-State Sensor and Actuator workshop, Technical Digest IEEE (Jan. 4, 1990).

* cited by examiner

FLEXURAL VIBRATION PIECE

BACKGROUND

1. Technical Field

The present invention relates to a flexural vibration piece that is used for various piezoelectric devices, such as vibrators or resonators, oscillators, gyroscopes, and various sensors, and other electronic devices, and vibrates in a flexural vibration mode.

2. Related Art

A flexural vibration mode piezoelectric vibration piece, such as a tuning-fork type piezoelectric vibration piece, generally has a structure in which grooves are formed at the front surface and/or the rear surface of the vibration arm in the longitudinal direction, and excitation electrodes are formed at the inner surfaces of the grooves (for example, see International Publication No. WO00/44092). Such a vibration arm is configured such that an electric field is generated between an excitation electrode at the side surface of the vibration arm and the excitation electrodes in the grooves so as to be widely distributed over the cross-section of the vibration arm, thereby significantly improving electric field efficiency. Therefore, even when the vibration piece is reduced in size, vibration loss can be made small, and the CI value can be suppressed at a low value.

In the flexural vibration mode piezoelectric vibration piece, if loss of vibration energy occurs at the time of flexural vibration of the vibration arm, deterioration in performance, such as an increase in the CI value or a decrease in the Q value, may occur. In order to prevent or reduce loss of vibration energy, a tuning-fork type crystal vibration piece is known in which cutout portions or cutout grooves having a predetermined depth are formed at both side portions of a base portion, from which the vibration arm extends (see JP-A-2002-261575 and JP-A-2004-260718). When vibration of the vibration arm includes a component in the vertical direction with respect to the main face of the vibration arm, that is, the out-plane direction, the cutout portions or cutout grooves of the base portion mitigate vibration leaking from the base portion. Thus, the confinement effect of vibration energy is increased, an increase in the CI value is suppressed, and a variation in the CI value between the vibration pieces is prevented.

Loss of vibration energy also is generated due to thermal conduction caused by a difference in temperature between a contracting portion of the vibration arm which flexural-vibrates and an expanding portion of the vibration arm to which tensile stress is applied. The decrease in the Q value due to thermal conduction is called a thermoelastic loss effect. In order to prevent or suppress the decrease in the Q value, a tuning-fork type vibrator is known in which a groove or a hole is formed on the center line of the vibration arm (vibration beam) having a rectangular cross-section (for example, see Japanese Utility Model Application No. 63-110151).

However, as described in Japanese Utility Model Application No. 63-110151, if a through hole is formed in the vibration arm, undesirably, rigidity of the vibration arm is significantly deteriorated. As described in the related art, in the piezoelectric vibration piece in which grooves are formed at the front and rear surface of the vibration arm on the center line, it is difficult to sufficiently prevent or suppress the decrease in the Q value due to the thermoelastic effect.

The inventors have suggested a flexural vibration piece in which a flexural vibration portion having a rectangular sectional shape and extending from a base portion to flexural-vibrate, that is, a vibration arm, has a first face and a second face, which are opposite each other and alternately expanded and contracted due to flexural vibration, and a third face and a fourth face, which are opposite each other and have grooves. In this flexural vibration piece, the grooves have a depth smaller than the distance between the third face and the fourth face, and the sum of the depths of the grooves is greater than the distance between the third face and the fourth face. The grooves are arranged between the first face and the second face. The grooves are provided in the above-described manner, such that the vibration arm has an S-shaped cross-section. Thus, the thermomigration path between the first face and the second face is extended, and the time until the difference in temperature between the expanding portion and the contracting portion of the vibration arm is mitigated by thermal conduction is extended, thereby suppressing the change in the Q value due to the thermoelastic effect.

It has been found that, at the time of flexural vibration of the vibration arm having an S-shaped cross-section, in which the grooves are formed in the above-described manner, the vibration arm may be displaced in the in-plane direction including the main faces at which the grooves are formed and in the vertical direction with respect to the main faces. FIGS. 9A to 10B schematically show the configuration of a tuning-fork type piezoelectric vibration piece including a vibration arm having an S-shaped cross-section.

Figure 9A:
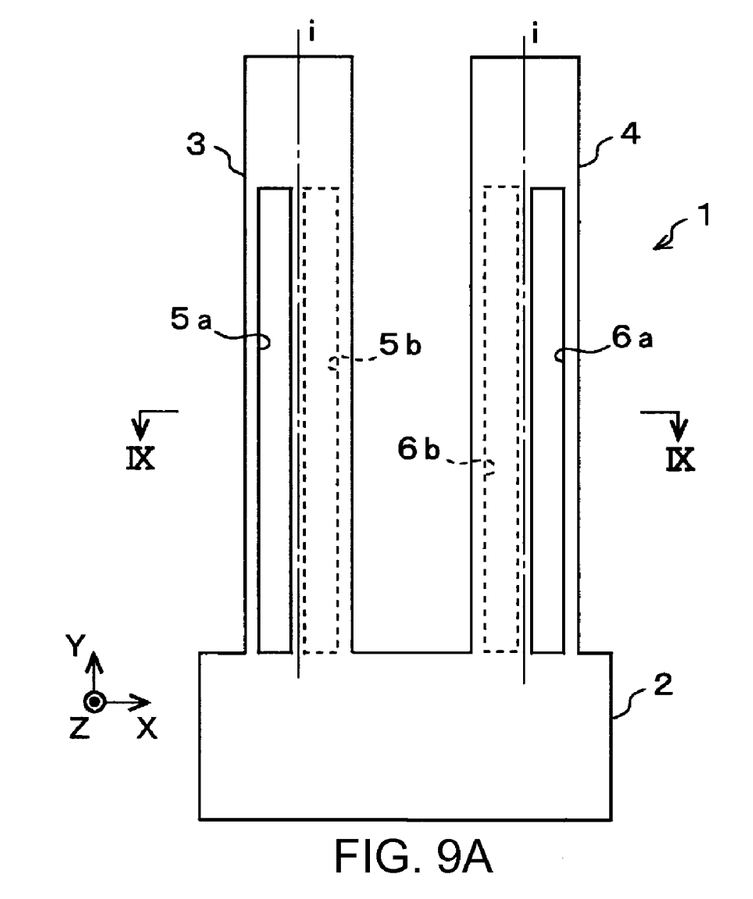
FIG. 9A is a schematic plan view of a tuning-fork type piezoelectric vibration piece of the related art.

A tuning-fork type piezoelectric vibration piece 1 of FIG. 9A has a pair of vibration arms 3 and 4 which extend in parallel from a base portion 2. At the front and rear main faces of the respective vibration arms, first grooves 5a and 6a and second grooves 5b and 6b are formed to extend in the longitudinal direction from the connection portions to the base portion. The first grooves 5a and 6a and the second grooves 5b and 6b have the same width, length, and depth. The piezoelectric vibration piece 1 of the related art is formed integrally of quartz. Of the quartz crystal axes, the electrical axis X is aligned in the width direction of the vibration arms, the mechanical axis Y is aligned in the longitudinal direction of the vibration arm, and the optical axis Z is aligned in the thickness of the vibration piece.

Figure 9B:
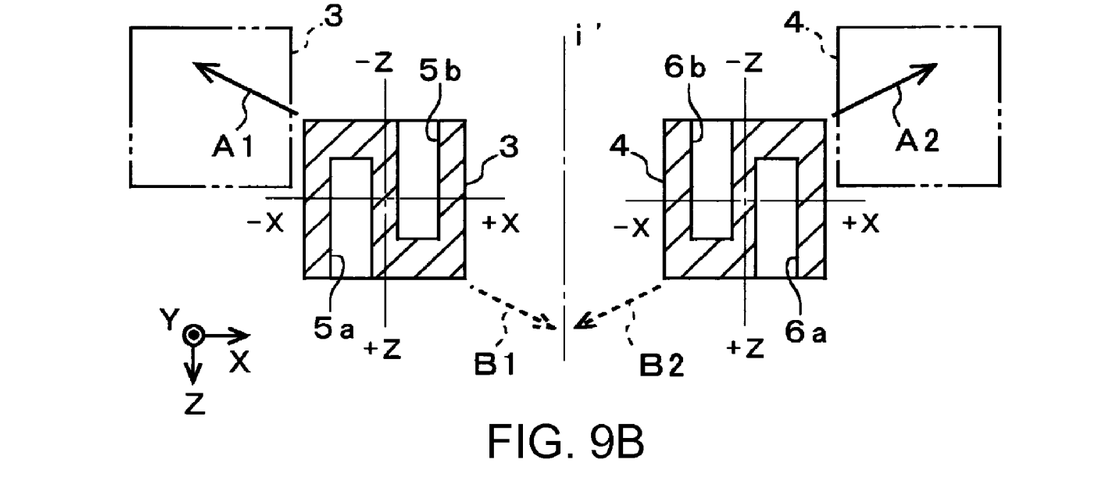
FIG. 9B is a sectional view of a vibration arm taken along the line IX-IX of FIG. 9A.

The first grooves 5a and 6a at the front-side main faces are arranged outside in the width direction with respect to the longitudinal center lines i of the vibration arms 3 and 4. That is, the groove at the front-side main face of one vibration arm is arranged on the opposite side to the other vibration arm. The second grooves 5b and 6b at the rear-side main face are arranged inside in the width direction with respect to the longitudinal center lines i of the vibration arms in the longitudinal direction. That is, the groove at the rear-side main face of one vibration arm is arranged to face the other vibration arm. As shown in FIG. 9B, the first grooves 5a and 6a and the second grooves 5b and 6b are provided so as to have a depth greater than half of the thickness of the vibration arms 3 and 4. The first grooves 5a and 6a and the second grooves 5b and 6b are provided so as not to overlap each other when viewed from the front and rear main faces of the vibration arms and so as to overlap each other from when viewed from the side faces. As a result, the vibration arms have an S-shaped cross-section which is line-symmetric with respect to the center line i' between the vibration arms.

First excitation electrodes (not shown) are respectively formed at the inner surfaces of the first grooves and the second grooves of the vibration arms 3 and 4. Second excitation electrodes (not shown) are respectively formed at both side faces of the vibration arms. The first excitation electrodes of one vibration arm are connected to the second excitation electrodes of the other vibration arm. An alternating-current voltage is applied to the first excitation electrodes and the second excitation electrodes, such that the vibration arms vibrate to approach or move away from each other.

At this time, it has been found that the vibration arms 3 and 4 have the vibration components in the in-plane of the front and rear main faces and the out-plane direction, that is, in the ±Z direction. When the vibration arms are bent to move away from each other, as indicated by the arrows A1 and A2 of FIG. 9B, the vibration arms are also displaced in the −Z direction. When the vibration arms are bent to approach each other, as indicated by the arrows B1 and B2 of FIG. 9B, the vibration arms are also displaced in the +Z direction.

Figure 10A:
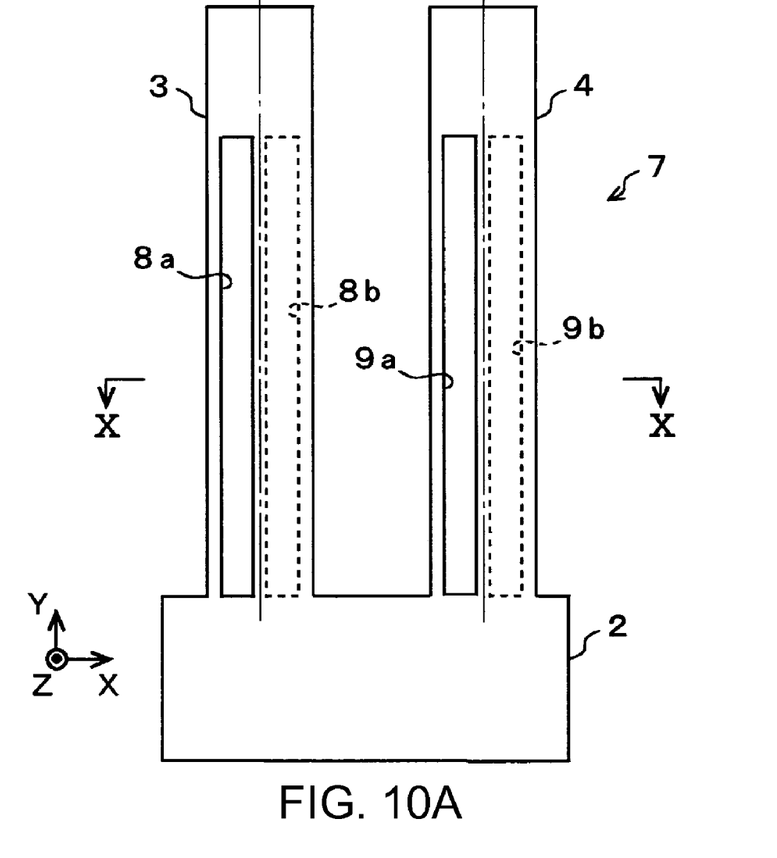
FIG. 10A is a schematic plan view of another tuning-fork type piezoelectric vibration piece of the related art.

A tuning-fork type piezoelectric vibration piece 7 of FIG. 10A, first grooves 8a and 9a at the front-side main face are arranged on the same sides in the width direction with respect to the longitudinal center lines i of the vibration arms 3 and 4, that is, the left sides in the drawing. Second grooves 8b and 9b at the rear-side main face are arranged on the same sides in the width direction with respect to the longitudinal center lines i of the vibration arms, that is, on the right sides in the drawing. Similarly to the piezoelectric vibration piece 1 of FIGS. 9A and 9B, the first grooves and the second grooves have a depth greater than half of the thickness of the vibration arms 3 and 4. The first grooves and the second grooves are provided so as not to overlap each other when viewed from the front and rear main faces of the vibration arms and so as to overlap each other when viewed from the side faces. Thus, as shown in FIG. 10B, the vibration arms of the piezoelectric vibration piece 7 have an S-shaped cross-section which is point-symmetric with respect to the center point O between the vibration arms.

In the tuning-fork type piezoelectric vibration piece 7, it has been found that, when an alternating-current voltage is applied to the first excitation electrodes formed at the first grooves and the second grooves and the second excitation electrodes at both side faces of the vibration arms, and the vibration arms 3 and 4 vibrate to approach or move away from each other, the vibration arms have the vibration components in the in-plane direction and the out-plane direction, that is, in the ±Z direction. When the vibration arms are bent to move away from each other, as indicated by the arrows A1 and A2 of FIG. 10B, the vibration arm 3 is also displaced in the −Z direction and the vibration arm 4 is also displaced in the +Z direction. When the vibration arms are bent to approach each other, as indicated by the arrows B1 and B2 of FIG. 10B, the vibration arm 3 is also displaced in the +Z direction and the vibration arm 4 is also displaced in the −Z direction.

Figure 10B:
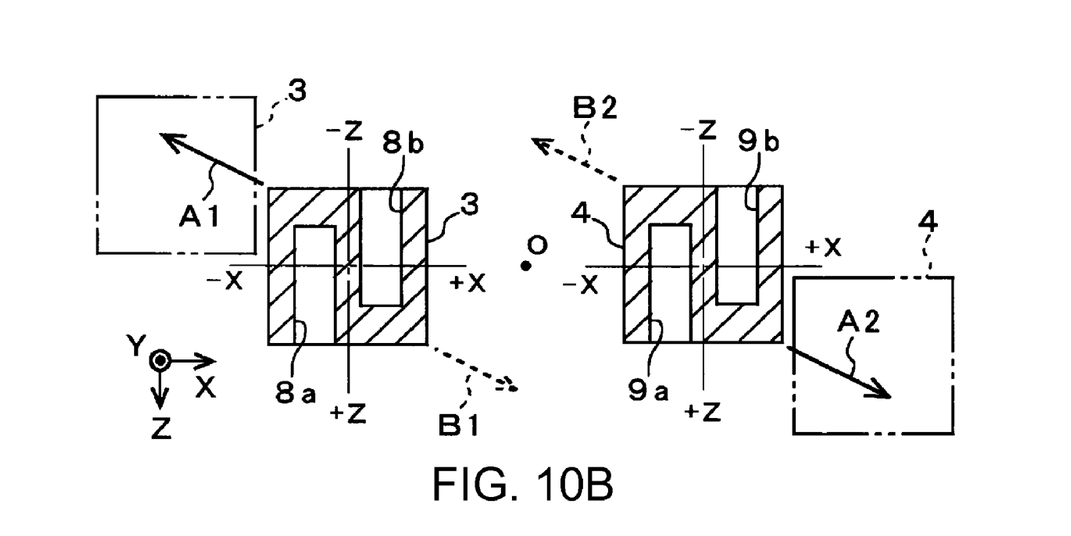
FIG. 10B is a sectional view of a vibration arm taken along the line X-X of FIG. 10A.

Referring to FIGS. 9B and 10B, when the cross-sections of each of the vibration arms is divided by the center lines in the X direction and the Z direction, it can be seen that the displacement in the ±Z direction at the time of flexural vibration of the vibration arms is generated to be attracted to a region having a greater mass. Referring to FIG. 9B, in the vibration arm 3, the displacement in the ±Z direction is generated from the center toward the −X and −Z region and the +X and +Z region where the first and second grooves 5a and 5b have a small occupying area. The same is applied to the vibration arm 4 in which the first and second grooves 6a and 6b are arranged to be different from those in the vibration arm 3. This is because the bending moment of the vibration arm is applied toward a region having a greater mass.

The vibration component in the ±Z direction of the vibration arm, that is, the out-plane vibration component, causes loss of vibration energy, that is, vibration leakage. For this reason, the Q value of the vibration piece decreases, and the CI value is deteriorated. In the flexural vibration piece, the reduction in size causes a decrease in the Q value, such that the decrease in the Q value due to vibration leakage interferes with reduction in size and thickness of the vibration piece.

SUMMARY

An advantage of some aspects of the invention is that it provides a flexural vibration piece, in which first and second grooves in a longitudinal direction are formed at first and second main faces arranged opposite each other of a vibration arm extending from a base portion, and the first and second grooves are arranged to be shifted to the opposite sides between the first and second main faces in a width direction with respect to a longitudinal center line of the vibration arm, and which is capable of eliminating or suppressing a vibration component in a vertical direction with respect to the first and second main faces at the time of flexural vibration of the vibration arm to eliminate or reduce vibration leakage, thereby improving a Q value, improving a CI value, achieving high performance, and realizing reduction in size and thickness.

According to an aspect of the invention, a flexural vibration piece includes a base portion, and a vibration arm extending from the base portion. The vibration arm has first and second main faces which are arranged to be opposite each other. The first main face have first groove which is formed in the longitudinal direction of the vibration arm. The second main face have second groove which is formed in the longitudinal direction of the vibration arm. The vibration arm further has a longitudinal center line which extends in the longitudinal direction of the vibration arm. The first groove has a plurality of first groove portions which are arranged on both sides with respect to the longitudinal center line. The plurality of first groove portions are shifted from each other in the longitudinal direction of the vibration arm. The second groove has a plurality of second groove portions which are arranged on both sides with respect to the longitudinal center line. The plurality of second groove portions are shifted from each other in the longitudinal direction of the vibration arm and are arranged on an opposite side to the first groove portions with respect to the longitudinal center line.

When the cross-section of the vibration arm, in which a plurality of first groove portions and second groove portions are arranged, is divided by the center lines in the width direction and the thickness direction, the region opposite to the opening of each of the first groove portions or the second groove portions in the width direction and the thickness direction has amass greater than other regions since the occupying area of the first groove portion or the second groove portion is small. The region having a greater mass alternately moves between the opposing diagonal positions at each of the positions corresponding to the next first and second groove portions in the longitudinal direction of the vibration arm. As a result, at the time of flexural vibration of the vibration arm, for each of the positions of the first and second groove portions in the longitudinal direction, the vibration components in the out-plane direction with respect to the first and second main faces occur in the reverse directions and cancel each other. Thus, the displacement in the out-plane direction of the vibration arm is eliminated or sufficiently suppressed as a whole, and vibration energy is confined in the in-plane direction of the first and second main faces, thereby preventing vibration leakage. Therefore, the Q value of the flexural vibration piece can be improved, the CI value can be suppressed, and reduction in size and thickness can be realized.

The plurality of first groove portions and second groove portions may have different widths in the longitudinal direction of the vibration arm, and the width of each of the first and second groove portions at a base end-side portion of the vibration arm may be set to be greater than the width of each of the first and second groove portions at a tip end-side portion of the vibration arm. Stress occurring at the base end-side portion of the vibration arm contributes to the displacement of the vibration arm in the out-plane direction more significantly than stress occurring at the tip end-side portion of the vibration arm. If the width of each of the first and second groove portions is set in such a manner, the displacement of the vibration arm in the out-plane direction can be satisfactorily eliminated or suppressed as a whole.

The plurality of first groove portions and second groove portions may have different lengths in the longitudinal direction of the vibration arm, and the length of each of the first and second groove portions at a base end-side portion of the vibration arm may be set to be smaller than the length of each of the first and second groove portions at a tip end-side portion of the vibration arm. As described above, stress occurring at the base end-side portion of the vibration arm contributes to the displacement of the vibration arm in the out-plane direction more significantly than stress occurring at the tip end-side portion of the vibration arm. If the length of each of the first and second groove portions is set in such a manner, the displacement of the vibration arm in the out-plane direction can be satisfactorily eliminated or suppressed as a whole.

Like a tuning-fork type flexural vibration piece having two vibration arms, the invention may be applied to a flexural vibration piece in which a plurality of vibration arms extend in parallel from the base portion and flexural-vibrate to approach or move away from each other.

The invention may be applied to a flexural vibration piece in which a plurality of vibration arms extend in parallel from the base portion and vibrates in a flexural mode in phases inverse to each other.

BRIEF DESCRIPTION OF THE DRAWINGS

The invention will be described with reference to the accompanying drawings, wherein like members reference like elements.

DESCRIPTION OF EXEMPLARY EMBODIMENTS

Hereinafter, exemplary embodiments of the invention will be described in detail with reference to the accompanying drawings. In the drawings, the same or similar parts are represented by the same or similar reference numerals.

Figure 1A:
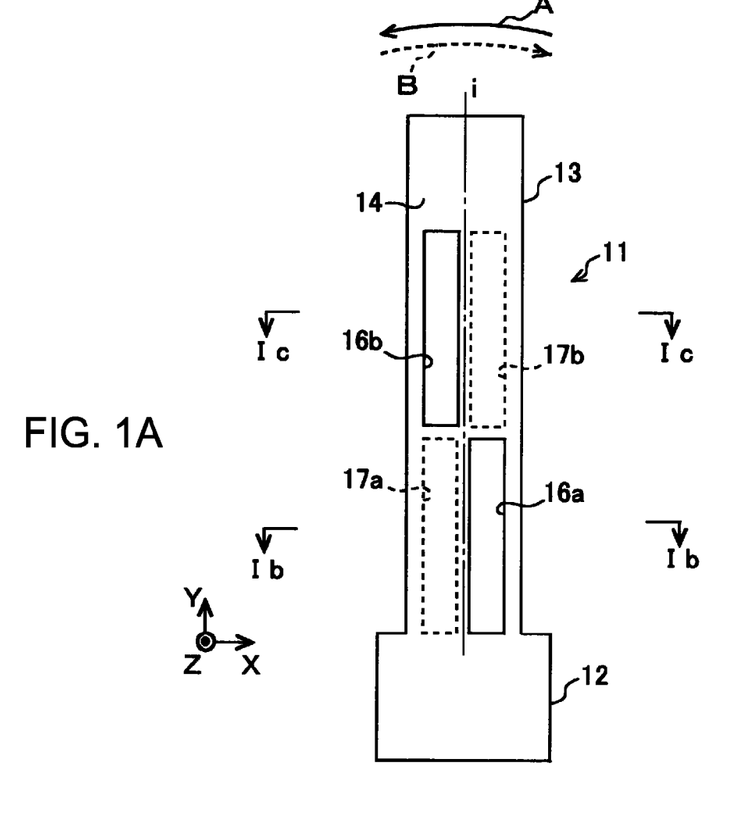
FIG. 1A is a schematic plan view of a flexural vibration piece according to a first embodiment of the invention.

FIG. 1A schematically shows a flexural vibration piece according to a first embodiment of the invention. A flexural vibration piece 11 of this embodiment has one vibration arm 13 which extends in parallel from a base portion 12. A first groove and a second groove are formed at front and rear main faces 14 and 15 of the vibration arm 13 so as to extend in the longitudinal direction from a connection portion to the base portion. The piezoelectric vibration piece 11 is formed integrally of quartz. Of the quartz crystal axes, the electrical axis X is aligned in the width direction of the vibration arm, the mechanical axis Y is aligned in the longitudinal direction of the vibration arm, and the optical axis Z is aligned in the thickness direction of the vibration piece. In another embodiment, a piezoelectric material other than quartz or a semiconductor material, such as silicon, may be used.

The first groove at the front-side main face 14 is divided into two first groove portions 16a and 16b which have the same width, length, and depth in the longitudinal direction of the vibration arm 13. The first groove portions are arranged to be alternately shifted on both sides in the width direction with respect to the longitudinal center line i of the vibration arm 13 in the longitudinal direction. Specifically, the first groove portion 16a which is close to the base end, that is, the base portion, is arranged on one side in the width direction with respect to the longitudinal center line i, that is, on the right side in the drawing. The first groove portion 16b which is away from the tip end, that is, the base portion, is arranged on the opposite side in the width direction with respect to the longitudinal center line i, that is, on the left side in the drawing.

Similarly, the second groove at the rear-side main face 15 is divided into two second groove portions 17a and 17b which have the same width, length, and depth in the longitudinal direction of the vibration arm 13. The second groove portions are arranged to be alternately shifted on both sides in the width direction with respect to the longitudinal center line i of the vibration arm 13 in the longitudinal direction. Specifically, the second groove portion 17a at the base end is arranged on one side in the width direction with respect to the longitudinal center line i, that is, on the left side in the drawing. The second groove portion 17b at the tip end is arranged on the opposite side in the width direction with respect to the longitudinal center line i, that is, on the right side in the drawing.

Figure 1B:
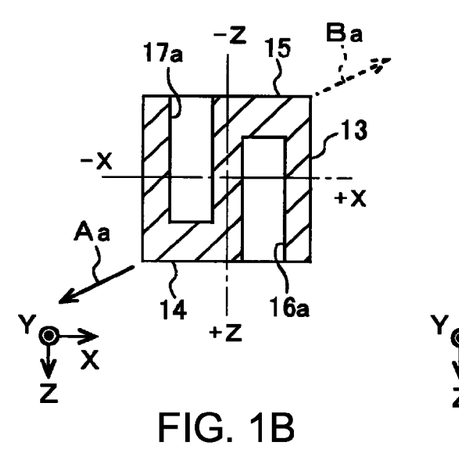
FIG. 1B is a sectional view of a vibration arm taken along the line IB-IB of FIG. 1A.
Figure 1C:
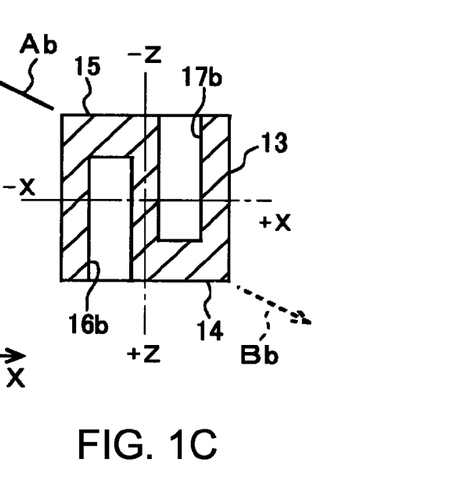
FIG. 1C is a sectional view taken along the line IC-IC of FIG. 1A.

As shown in FIGS. 1B and 1C, the first groove portions 16a and 16b and the second groove portions 17a and 17b have a depth greater than half of the thickness of the vibration arm 13. The first groove portions 16a and 16b and the second groove portions 17a and 17b overlap each other when viewed from the side face of the vibration arm. The first groove portions 16a and 16b and the second groove portions 17a and 17b which are at the corresponding positions in the longitudinal direction of the vibration arm are arranged on the opposite sides in the width direction with respect to the longitudinal center line i so as not to overlap each other when viewed from the front and rear main faces. Therefore, in the vibration arm 13, the base end-side portion at which the first and second groove portions 16a and 17a are provided and the tip end-side portion at which the first and second groove portions 16b and 17b are provided have an S-shaped cross-section which is mirror-symmetric.

If the cross-section of the vibration arm 13 is divided by the center lines in the width direction and the thickness direction, as shown in FIG. 1B, at the base end-side portion, the mass of each of the –X and +Z region and the +X and –Z region where each of the first and second groove portions 16a and 17a has a small occupying area is greater than the mass of each of the –X and –Z region and the +X and +Z region. As shown in FIG. 1C, at the tip end-side portion of the vibration arm 13, the mass of the –X and –Z region and the +X and +Z region where the first and second groove portions 16b and 17b have a small occupying area is greater than the –X and +Z region and the +X and –Z region.

First excitation electrodes (not shown) are formed at the side surfaces of the first groove portions 16a and 16b and the second groove portions 17a and 17b adjacent to the side faces of the vibration arm 13. Second excitation electrodes (not shown) are formed on both side faces of the vibration arm. If a predetermined alternating-current voltage is applied to the first excitation electrodes and the second excitation electrodes, the vibration arm 13 flexural-vibrates in the directions indicated by arrows A and B of FIG. 1A.

At this time, as indicated by arrows Aa and Ba of FIG. 1B, the base end-side portion of the vibration arm 13 tends to be bent from the cross-sectional center in the directions toward the –X and +Z region and the +X and –Z region having a greater mass. Meanwhile, as indicated by arrows Ab and Bb of FIG. 1C, the tip end-side portion of the vibration arm 13 tends to be bent from the cross-sectional center in the directions toward the –X and –Z region and the +X and +Z region having a greater mass in the same manner. As a result, over the entire vibration arm 13, the vibration components in the ±Z direction cancel each other.

Thus, in the vibration arm 13, the displacement in the ±Z direction can be eliminated or sufficiently suppressed, and vibration energy can be confined in the in-plane direction of the front and rear main faces 14 and 15. Therefore, the Q value of the flexural vibration piece 11 can be improved, the CI value can be suppressed, and as a result, reduction in size and thickness can be realized.

Figure 2A:
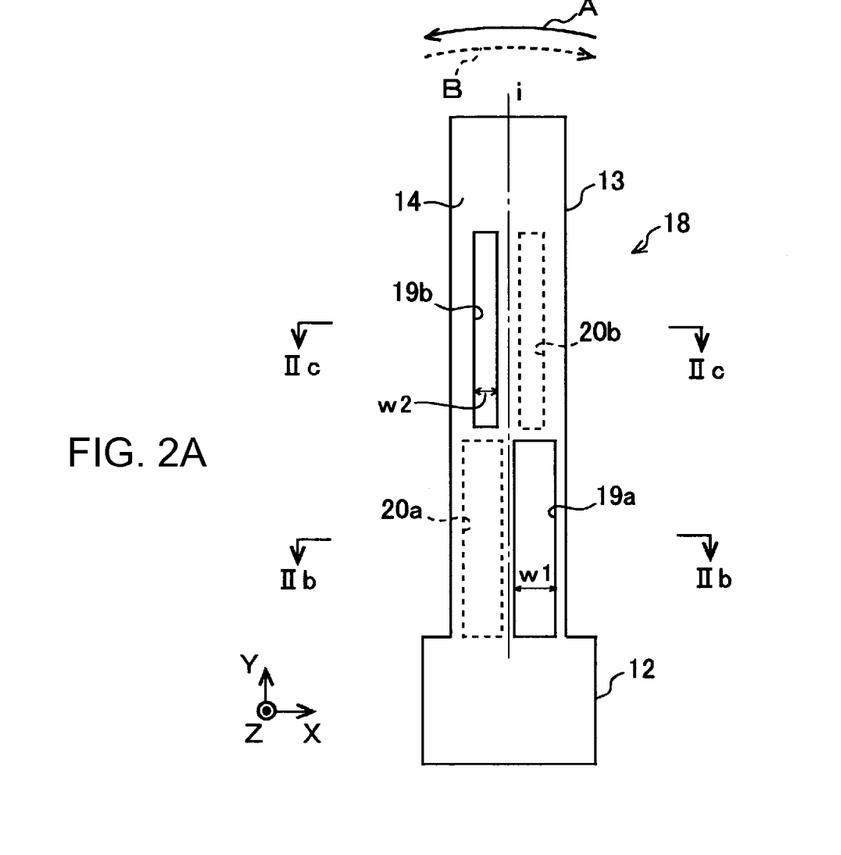
FIG. 2A is a schematic plane view of a flexural vibration piece according to a second embodiment of the invention.

FIG. 2A schematically shows a piezoelectric vibration piece according to a second embodiment of the invention. A flexural vibration piece 18 of this embodiment is different from the first embodiment of FIGS. 1A to 1C in that the width w1 of each of first and second groove portions 19a and 20a at the base end is different from the width w2 of each of first and second groove portions 19b and 20b at the tip end, and the condition w1>w2 is satisfied.

Figure 2B:
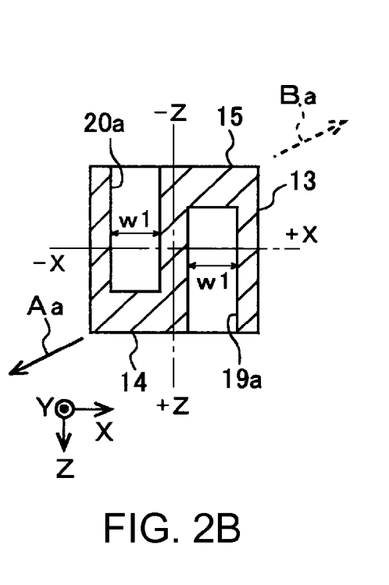
FIG. 2B is a sectional view of a vibration arm taken along the line IIB-IIB of FIG. 2A.
Figure 2C:
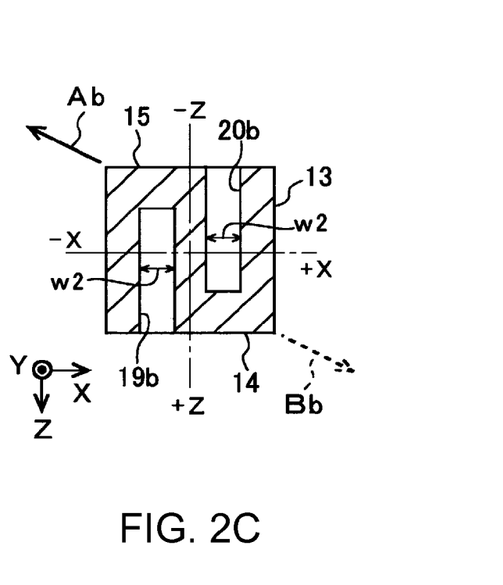
FIG. 2C is a sectional view taken along the line IIC-IIC of FIG. 2A.

If the vibration arm 13 flexural-vibrates in the directions indicated by arrows A and B of FIG. 2A, as indicated by arrows Aa and Ba of FIG. 2B, the base end-side portion of the vibration arm 13 tends to be bent from the cross-sectional center in the directions toward the –X and +Z region and the +X and –Z region having a greater mass. Meanwhile, as indicated by arrows Ab and Bb of FIG. 2C, the tip end-side portion of the vibration arm 13 tends to be bent from the cross-sectional center in the directions toward the –X and –Z region and the +X and +Z region having a greater mass in the same manner.

It has been confirmed that stress occurring at the base end of the vibration arm contributes to the displacement of the vibration arm 13 in the out-plane direction more significantly than stress occurring at the tip end of the vibration arm. Thus, as described above, if the widths of the first and second groove portions 19a, 19b, 20a, and 20b are set to be different at the base end and the tip end, over the entire vibration arm 13, the vibration components in the out-plane direction can satisfactorily cancel each other, and the displacement in the out-plane direction can be eliminated or suppressed. Therefore, the Q value of the flexural vibration piece 18 can be further improved, and the CI value can be further effectively suppressed.

Figure 3A:
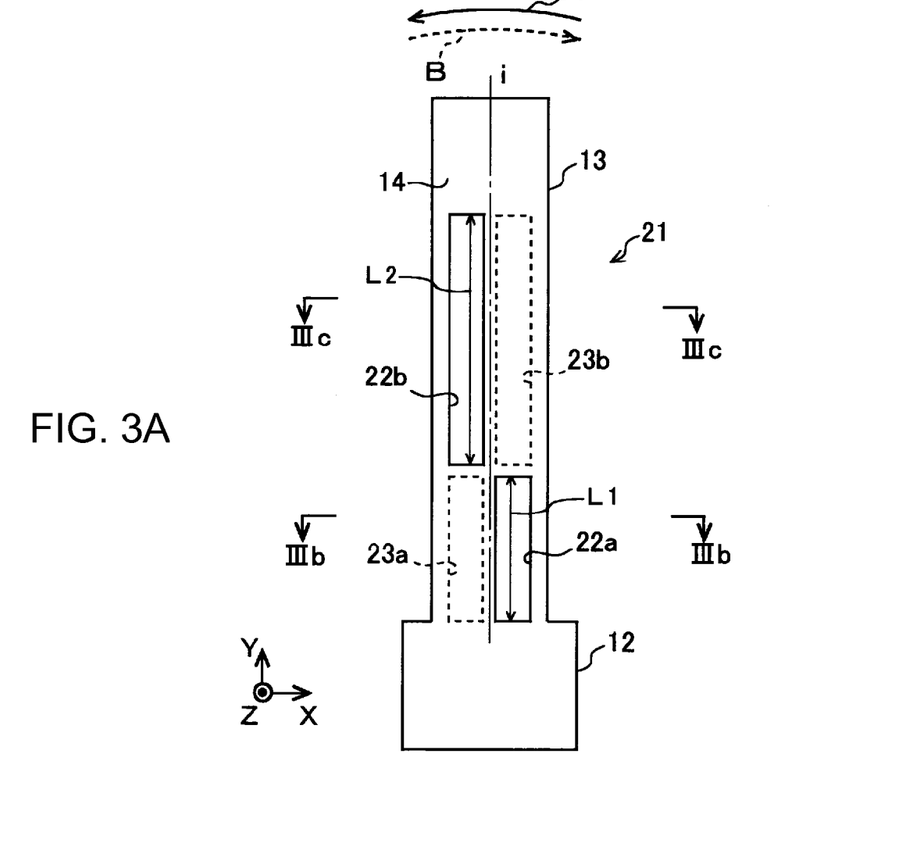
FIG. 3A is a schematic plan view of a flexural vibration piece according to a third embodiment of the invention.

FIG. 3A schematically shows a piezoelectric vibration piece according to a third embodiment of the invention. A flexural vibration piece 21 of this embodiment is different from the first embodiment of FIGS. 1A to 1C in that the length L1 of each of first and second groove portions 22a and 23a at the base end is different from the length L2 of each of first and second groove portions 22b and 23b at the tip end, and the condition L1<L2 is satisfied.

Figure 3B:
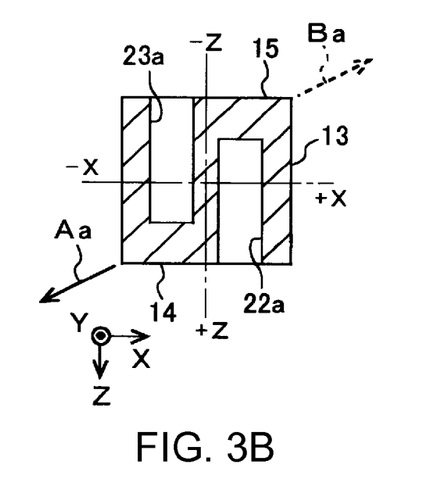
FIG. 3B is a sectional view of a vibration arm taken along the line IIIB-IIIB of FIG. 3A.
Figure 3C:
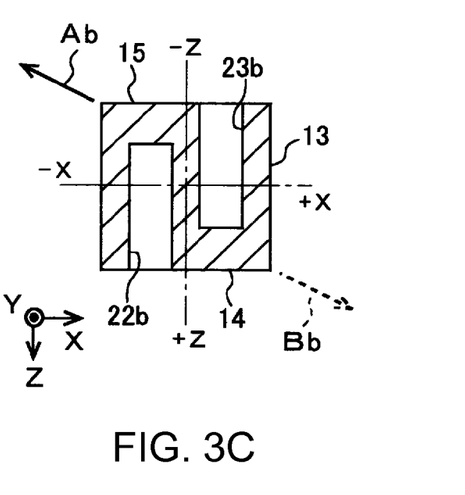
FIG. 3C is a sectional view taken along the line IIIC-IIIC of FIG. 3A.

If the vibration arm 13 flexural-vibrates in the directions indicated by arrows A and B of FIG. 3A, as indicated by arrows Aa and Ba of FIG. 3B, the base end-side portion of the vibration arm 13 tends to be bent from the cross-sectional center in the directions toward the –X and +Z region and the +X and –Z region having a greater mass. Meanwhile, as indicated by arrows Ab and Bb of FIG. 3C, the tip end-side portion of the vibration arm 13 tends to be bent from the cross-sectional center in the directions toward the –X and –Z region and the +X and +Z region having a greater mass in the same manner.

It has been confirmed that stress occurring at the base end of the vibration arm contributes to the displacement of the vibration arm 13 in the out-plane direction more significantly than stress occurring at the tip end of the vibration arm. Thus, as described above, if the lengths of the first and second groove portions 22a, 22b, 23a, and 23b are set to be different at the base end and the tip end, over the entire vibration arm 13, the vibration components in the out-plane direction can cancel each other, and the displacement in the out-plane direction can be eliminated or suppressed. Therefore, the Q value of the flexural vibration piece 18 can be further improved, and the CI value can be further effectively suppressed.

In another embodiment, the second embodiment may be incorporated into the third embodiment. For example, the width of each of the first and second groove portions 22a and 23a at the base end may be greater or smaller than the width of each of the first and second groove portions 22b and 23b at the tip end.

Figure 4A:
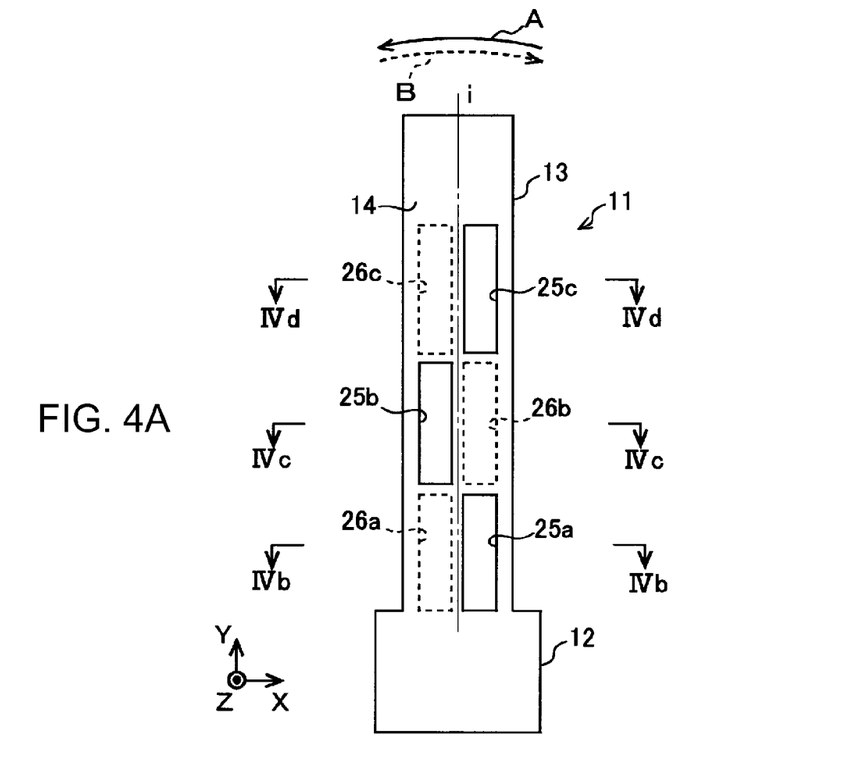
FIG. 4A is a schematic plan view of a flexural vibration piece according to a fourth embodiment of the invention.

FIG. 4A schematically shows a piezoelectric vibration piece according to a fourth embodiment of the invention. A flexural vibration piece 24 of this embodiment is different from the first embodiment of FIGS. 1A to 1C in that a first groove at the front-side main face 14 is divided into three first groove portions 25a to 25c which have the same width, length, and depth in the longitudinal direction of the vibration arm 13, and similarly, a second groove at the rear-side main face 15 is divided into three second groove portions 26a to 26c which have the same width, length, and depth in the longitudinal direction of the vibration arm 13. The first groove portions 25a to 25c are arranged to be alternately shifted on both sides in the width direction with respect to the longitudinal center line i of the vibration arm 13 in the longitudinal direction. The second groove portions 26a to 26c are arranged to be alternately shifted on both sides in the width direction with respect to the longitudinal center line i. The second groove portions 26a to 26c are arranged on the opposite sides in the width direction with respect to the longitudinal center line i so as not to overlap the first groove portions 25a to 25c when viewed from the front and rear main faces of the vibration arm.

Figure 4B:
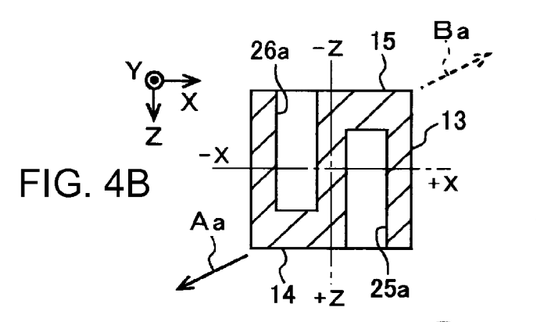
FIG. 4B is a sectional view of a vibration arm taken along the line IVB-IVB of FIG. 4A.
Figure 4C:
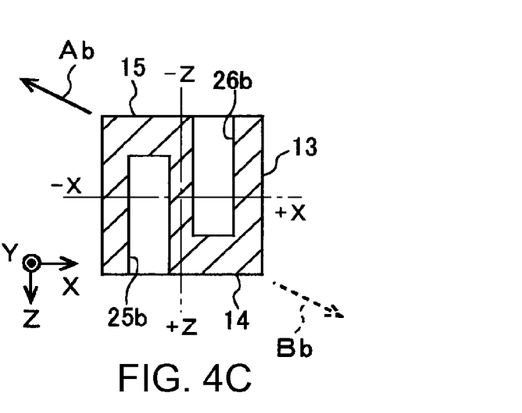
FIG. 4C is a sectional view taken along the line IVC-IVC of FIG. 4A
Figure 4D:
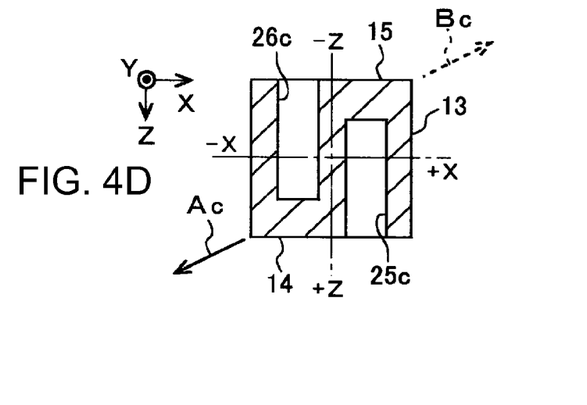
FIG. 4D is a sectional view taken along the line IVD-IVD of FIG. 4A.

If the vibration arm 13 flexural-vibrates in the directions indicated by arrows A and B of FIG. 4A, as indicated by arrows Aa and Ba of FIG. 4B, the base end-side portion of the vibration arm 13 tends to be bent from the cross-sectional center in the directions toward the −X and +Z region and the +X and −Z region having a greater mass. As indicated by arrow Ab and Bb of FIG. 4C, a central portion of the vibration arm 13 tends to be bent from the cross-sectional center in the directions toward the −X and −Z region and the +X and +Z region having a greater mass. Similarly to the base end-side portion, as indicated by the arrows Ab and Bb of FIG. 4C, the tip end-side portion of the vibration arm 13 tends to be bent from the cross-sectional center in the directions toward the −X and +Z region and the +X and −Z region having a greater mass.

If the number of first and second divided groove portions increases, each time the arrangement of the first and second groove portions in the width direction of the vibration arm changes, the direction of the in-plane vibration component frequently and repeatedly changes reversely in the length direction from the base end of the vibration arm 13 toward the tip end of the vibration arm 13. As a result, the vibration arm can smoothly flexural-vibrate in the in-plane direction as a whole. In another embodiment, the first and second grooves may be divided into four or more first and second groove portions.

In another embodiment, the second and third embodiment may be incorporated into the fourth embodiment separately or together. For example, the first groove portions 25a to 25c and the second groove portions 26a and 26c may be set to have different lengths, different widths, and different lengths and widths in the longitudinal direction of the vibration arm 13.

Figure 5A:
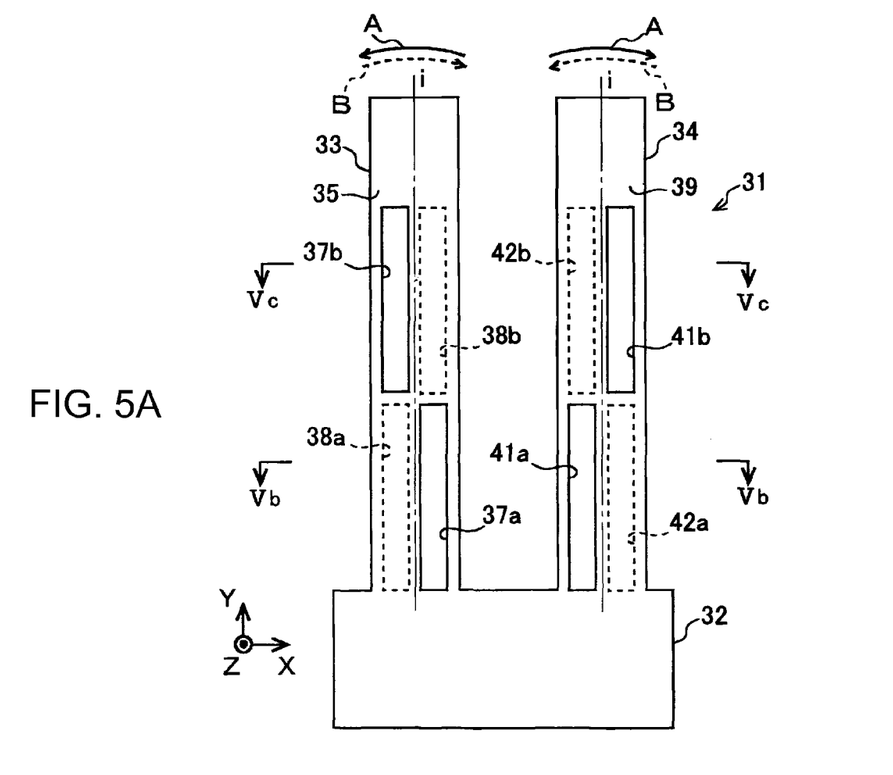
FIG. 5A is a schematic plan view of a flexural vibration piece according to a fifth embodiment of the invention.

FIG. 5A schematically shows a piezoelectric vibration piece according to a fifth embodiment of the invention. A flexural vibration piece 31 of this embodiment is a tuning-fork type flexural vibration piece which has a pair of vibration arms 33 and 34 extending in parallel from a base portion 32.

A first groove and a second groove are formed at front and rear main faces 35 and 36 of the vibration arm 33 so as to extend in the longitudinal direction from connection portions to the base portion. The first groove at the front-side main face 35 is divided into two first groove portions 37a and 37b which have the same width, length, and depth in the longitudinal direction of the vibration arm 13. The first groove portions are arranged to be alternately shifted on both sides in the width direction with respect to the longitudinal center line i of the vibration arm 33 in the longitudinal direction. Similarly, the second groove at the rear-side main face 36 is divided into two second groove portions 38a and 38b which have the same width, length, and depth in the longitudinal direction of the vibration arm 33. The second groove portions are arranged to be alternately shifted on both sides in the width direction with respect to the longitudinal center line i.

Similarly, a first groove and a second groove are formed at front and rear main faces 39 and 40 of the vibration arm 34 so as to extend in the longitudinal direction from connection portions to the base portion. The first groove at the front-side main face 39 is divided into two first groove portions 41a and 41b which have the same width, length, and depth in the longitudinal direction of the vibration arm 34. The first groove portions are arranged to be alternately shifted on both sides in the width direction with respect to the longitudinal center line i of the vibration arm 33 in the longitudinal direction. Similarly, the second groove portions at the rear-side main face 40 is divided into two second groove portions 42a and 42b which have the same width, length, and depth in the longitudinal direction of the vibration arm 34. The second groove portions are arranged to be alternately shifted on both sides in the width direction with respect to the longitudinal center line i.

Figure 5B:
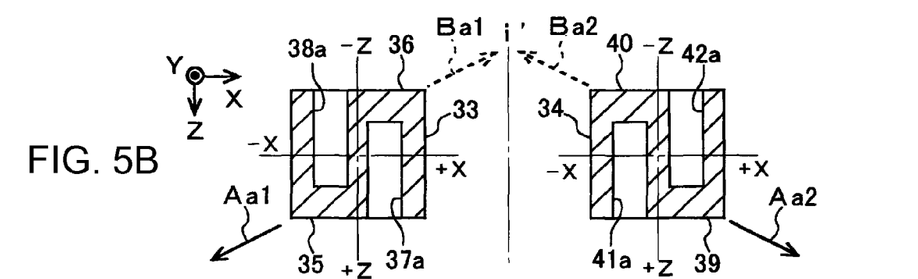
FIG. 5B is a sectional view of a vibration arm taken along the line VB-VB of FIG. 5A.
Figure 5C:
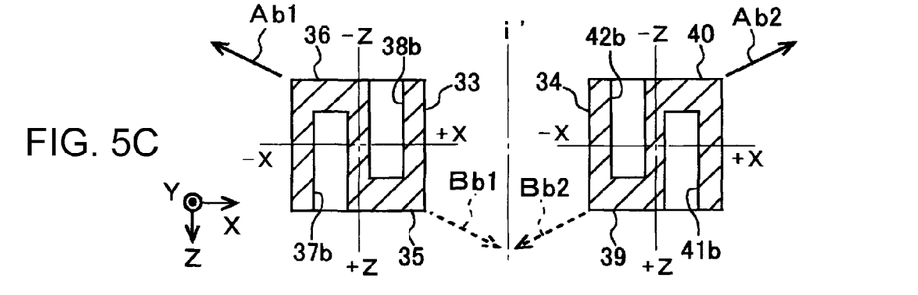
FIG. 5C is a sectional view taken along the line VC-VC of FIG. 5A.

As shown in FIGS. 5B and 5C, the first grooves at the front-side main faces 35 and 39 of both vibration arms 33 and 34 are provided to be symmetric with respect to a center line i' between both vibration arms. The first groove portions 37a and 41a at the base end are arranged to be adjacent each other, and the first groove portions 37b and 41b at the tip end are arranged on the opposite sides. Similarly, the second grooves at the rear-side main faces 36 and 40 of both vibration arms 33 and 34 are provided to be symmetric with respect to the center line i' between both vibration arms. The first groove portions 38b and 42b at the tip end are arranged to be adjacent to each other, and the first groove portions 38a and 42a are arranged on the opposite sides. Therefore, the base end-side portion and the tip end-side portion of each of both vibration arms 33 and 34 have an S-shaped cross-section which is line-symmetric with respect to the center line i'.

As shown in FIG. 5B, if the cross-section of the vibration arm 33 is divided by the center lines in the width direction and the thickness direction, at the base end-side portion, the mass of each of the −X and +Z region and the +X and −Z region where each of the first and second groove portions 36a and 38a has a small occupying area is greater than the mass of each of the −X and −Z region and the +X and +Z region. At the base end-side portion of the vibration arm 34 having a cross-sectional shape, which is line-symmetric with the vibration arm 33, the mass of each of the +X and +Z region and the −X and −Z region where each of the first and second groove portions 41a and 42a has a small occupying area is greater than the mass of each of the −X and +Z region and the +X and −Z region.

As shown in FIG. 5C, at the tip end-side portion of the vibration arm 33, the mass of each of the −X and −Z region and the +X and +Z region where each of the first and second groove portions 37b and 38b has a small occupying area is greater than the mass of each of the −X and +Z region and the +X and −Z region. Symmetrically, at the tip end-side portion of the vibration arm 34, the mass of each of the +X and −Z region and the −X and +Z region where each of the first and second groove portions 41b and 42b has a small occupying area is greater than the mass of each of the −X and −Z region and the +X and +Z region.

First excitation electrodes (not shown) are formed at the inner surfaces of the first and second grooves of the vibration arms 33 and 34, and second excitation electrodes (not shown) are formed at both side faces of the vibration arms. The first excitation electrodes of one vibration arm are connected to the second excitation electrodes of the other vibration arm. If an alternating-current voltage is applied to the first excitation electrodes and the second excitation electrodes, both vibration arm vibrates to approach or move away from each other, as indicated by arrows A and B of FIG. 5A.

At this time, as indicated by arrows Aa1 and Ba1 of FIG. 5B, the base end-side portion of the vibration arm 33 tends to be bent from the cross-sectional center in the directions toward the −X and +Z region and the +X and −Z region having a greater mass. As indicated by arrows Aa2 and Ba2 of FIG. 5B, the base end-side portion of the vibration arm 34 tends to be bent from the cross-sectional center in the directions toward the +X and +Z region and the −X and −Z region having a greater mass. Meanwhile, as indicated by arrows Ab1 and Bb1 of FIG. 5C, the tip end-side portion of the vibration arm 33 tends to be bent from the cross-sectional center in the directions toward the −X and −Z direction and the +X and +Z direction having a greater mass. As indicated by arrows Ab2 and Bb2 of FIG. 5C, the tip end-side portion of the vibration arm 34 tends to be bent from the cross-sectional center in the directions toward the +X and −Z region and the −X and +Z region having a greater mass.

As described above, the base end-side portion of both vibration arms 33 and 34 have the out-plane vibration components in the same direction as the Z direction, and the tip end-side portions of both vibration arms 33 and 34 have the out-plane vibration components in the same direction as the Z direction and in the reverse direction to the base end-side portions. As a result, in the case of the vibration arms 33 and 34, the vibration components in the ±Z direction cancel each other as a whole, and the displacement in the ±Z direction is eliminated or suppressed. Therefore, in the case of the flexural vibration piece 31, the Q value can be improved, the CI value can be suppressed, and as a result, reduction in size and thickness can be realized.

Figure 6A:
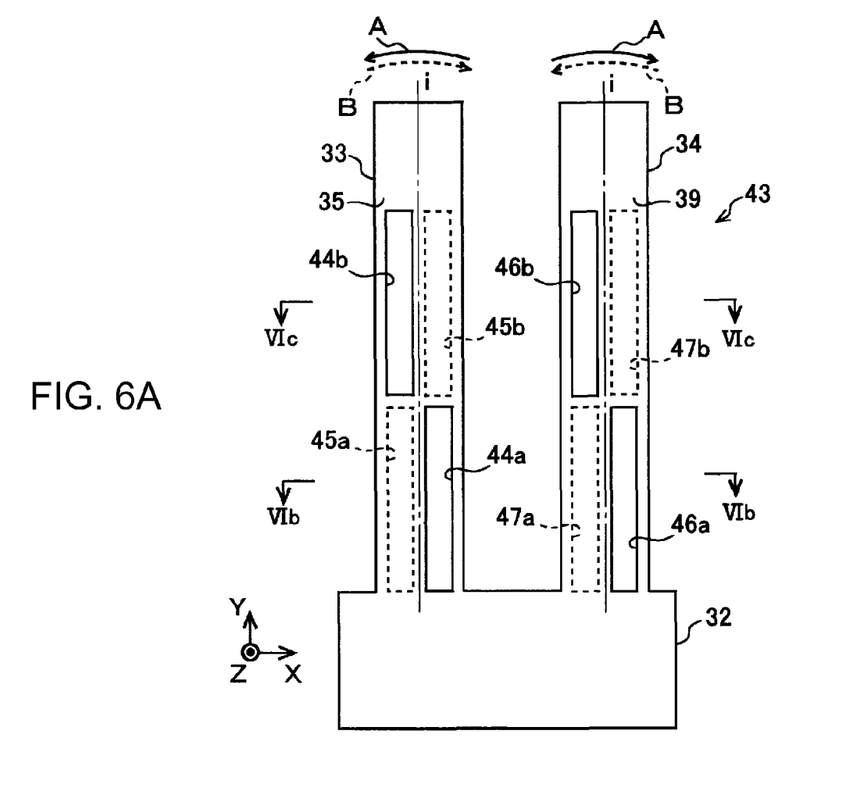
FIG. 6A is a schematic plan view of a flexural vibration piece according to a sixth embodiment of the invention.

FIG. 6A schematically shows a piezoelectric vibration piece according to a sixth embodiment of the invention. A flexural vibration piece 43 of this embodiment is a tuning-fork type flexural vibration piece which is a modification of the fifth embodiment, and has a pair of vibration arms 33 and 34 extending in parallel from the base portion 32. The vibration arm 33 has the same configuration as the fifth embodiment. A first groove portion 44a at the base end of the front-side main face 35 is arranged to be adjacent to the vibration arm 34 and a first groove portion 44b at the tip end is arranged on the opposite side to the vibration arm 34. A second groove portion 45b at the tip end of the rear-side main face 36 is arranged to be adjacent to the vibration arm 34 and a second groove portion 45a at the base end is arranged on the opposite to the vibration arm 34.

In the case of the vibration arm 34, the first groove portion 46b at the tip end of the front-side main face 35 is arranged to be adjacent to the vibration arm 33 and the first groove portion 46a at the base end is arranged on the opposite side to the vibration arm 33. The second groove portion 47a at the base end of the rear-side main face 36 is arranged to be adjacent to the vibration arm 33 and the second groove portion 47b at the tip end is arranged on the opposite side to the vibration arm 33. This is different from the flexural vibration piece 31 of the fifth embodiment. Thus, as shown in FIGS. 6B and 6C, the base end-side portion and the tip end-side portion of each of both vibration arms 33 and 34 have an S-shaped cross section which is point-symmetric with respect to the center O between both vibration arms.

Figure 6B:
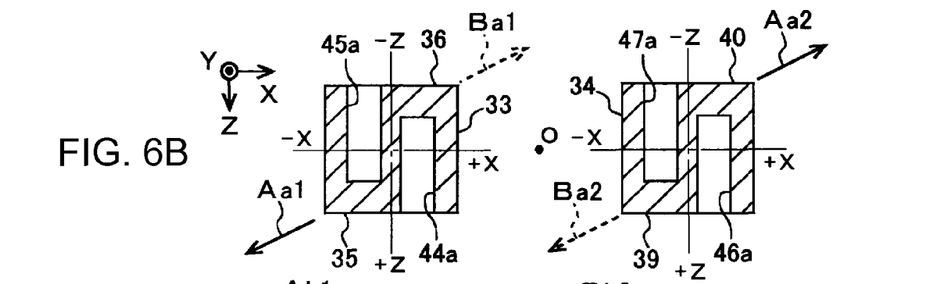
FIG. 6B is a sectional view of a vibration arm taken along the line VIB-VIB of FIG. 6A.
Figure 6C:
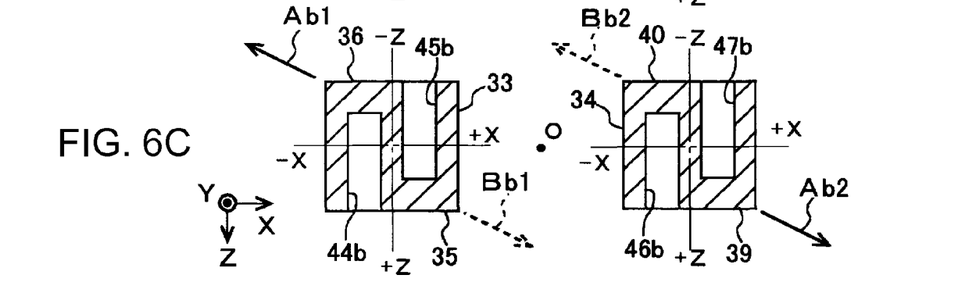
FIG. 6C is a sectional view taken along the line VIC-VIC of FIG. 6A.

Thus, as indicated by arrows A and B of FIG. 6A, if the flexural vibration piece 43 flexural-vibrates to approach or move away from each other, as indicated by arrows Aa1 and Ba1 of FIG. 6B, the base end-side portion of the vibration arm 33 tends to be bent from the cross-sectional center in the directions toward the −X and +Z region and the +X and −Z region having a greater mass. As indicated by arrows Aa2 and Ba2 of FIG. 6B, the base end-side portion of the vibration arm 34 tends to be bent from the cross-sectional center in the directions toward the +X and −Z region and the −X and +Z region having a greater area. Meanwhile, as indicated by arrows Ab1 and Bb1 of FIG. 6C, the tip end-side portion of the vibration arm 33 tends to be bent from the cross-sectional center in the directions toward the −X and −Z region and the +X and +Z region having a greater mass. As indicated by arrows Ab2 and Bb2 of FIG. 6C, the tip end-side portion of the vibration arm 34 tends to be bent from the cross-sectional center in the directions toward the +X and +Z region and the −X and −Z region having a greater mass.

As described above, the base end-side portions of both vibration arms 33 and 34 have the out-plane vibration components in the reverse direction to the Z direction, and the tip end-side portions of both vibration arms 33 and 34 have the out-plane vibration components in the reverse direction to the Z direction and in the reverse direction to the base end-side portion. As a result, in the case of the vibration arms 33 and 34, the vibration components in the ±Z direction cancel each other as a whole, and the displacement in the ±Z direction is eliminated or suppressed. Therefore, in the case of the flexural vibration piece 43, the Q value can be improved, the CI value can be suppressed, and as a result, reduction in size and thickness can be realized.

In another embodiment, the flexural vibration pieces 31 and 43 of FIGS. 5A to 5C and FIGS. 6A to 6C may have the vibration arms 33 and 34 having the same configuration as that in each of the second to fourth embodiments, or may have the vibration arms in the second to fourth embodiments in combination. In yet another embodiment, the invention may be applied to a tuning-fork type flexural vibration piece having three or more vibration arms.

Figure 7A:
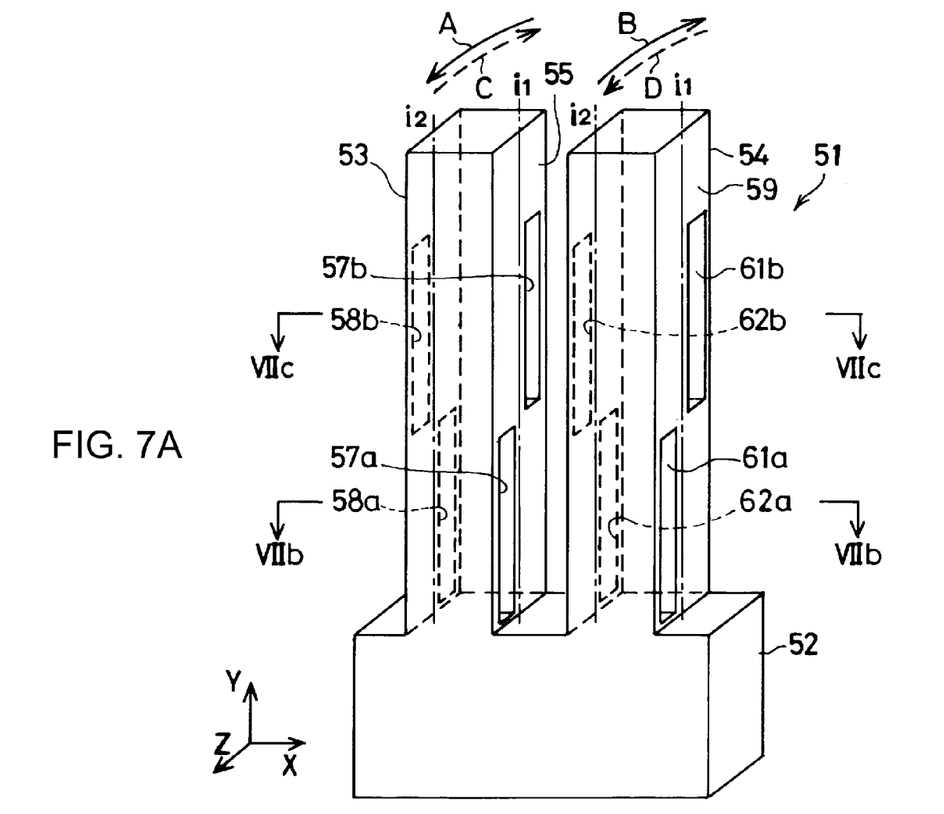
FIG. 7A is a schematic plan view of a flexural vibration piece according to a seventh embodiment of the invention.

FIG. 7A schematically shows a piezoelectric vibration piece according to a seventh embodiment of the invention. Similarly to the fifth and sixth embodiments, a flexural vibration piece 51 of this embodiment is a tuning-fork type flexural vibration piece which has a pair of vibration arms 53 and 54 extending in parallel from a base portion 52. However, the flexural vibration piece 51 of this embodiment is different from the tuning-fork type flexural vibration pieces of the fifth and sixth embodiment in that, as indicated by arrows A to D of FIG. 7A, the vibration arms 53 and 54 vibrate in an inverse-phase flexural vibration mode, called walk vibration, in the vertical direction with respect to the front and rear faces of the relevant vibration arm. The piezoelectric vibration piece 51 is also formed integrally of quartz. However, unlike the foregoing embodiments, of the quartz crystal axes, the electrical axis X is aligned in the thickness direction of the vibration piece, the mechanical axis Y is aligned in the longitudinal direction of the vibration arm, and the optical axis Z is aligned in the width direction of the vibration piece. In another embodiment, a piezoelectric material other than quartz or a semiconductor material, such as silicon, may be used.

The flexural vibration piece 51 has first and second main faces which are arranged to be opposite each other in the width direction of the vibration arms 53 and 54. The vibration arm 53 has a first main face 55 facing the vibration arm 54 and a second main face 56 on the opposite side to the vibration arm 54. A first groove and a second groove are respectively formed at the first main face 55 and the second main face 56 so as to extend in the longitudinal direction from a connection portion to the base portion. The first groove at the first main face 55 is divided into two first groove portions 57a and 57b which have the same width, length, and depth in the longitudinal direction of the vibration arm 53. The first groove portions are arranged to be alternately shifted on both sides with respect to a longitudinal center line i1 of the vibration arm 53 in the longitudinal direction. The second groove at the second main face 56 is divided into two second groove portions 58a and 58b which have the same width, length, and depth in the longitudinal direction of the vibration arm 53. The second groove portions are arranged to be alternately shifted on both sides with respect to a longitudinal center line i2 of the vibration arm 53 in the longitudinal direction.

Similarly, the vibration arm 54 has a first main face 59 on the opposite side of the vibration arm 53 and a second main face 60 facing the vibration arm 53. A first groove and a second groove are respectively formed at the first main face 59 and the second main face 60 so as to extend in the longitudinal direction from a connection portion to the base portion. The first groove at the first main face 59 is divided into two first groove portions 61a and 61b which have the same width, length, and depth in the longitudinal direction of the vibration arm 54. The first groove portions are arranged to be alternately shifted on both sides with respect to a longitudinal center line i1 of the vibration arm 54 in the longitudinal direction. The second groove portion at the second main face 60 is divided into two second groove portions 62a and 62b which have the same width, length, and depth in the longitudinal direction of the vibration arm 54. The second groove portions are arranged to be alternately shifted on both sides with respect to a longitudinal center line i2 of the vibration arm 54 in the longitudinal direction.

Figure 7B:
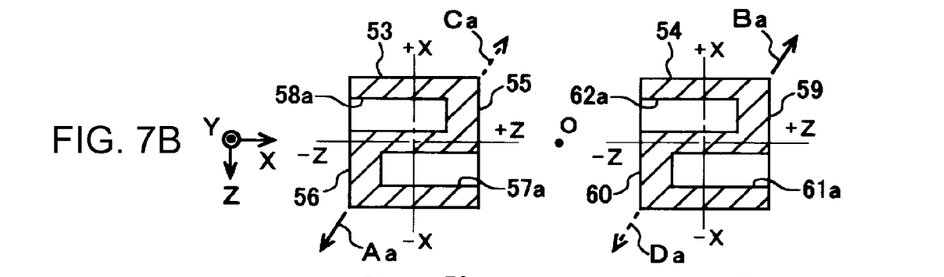
FIG. 7B is a sectional view of a vibration arm taken along the line VIIB-VIIB of FIG. 7A.
Figure 7C:
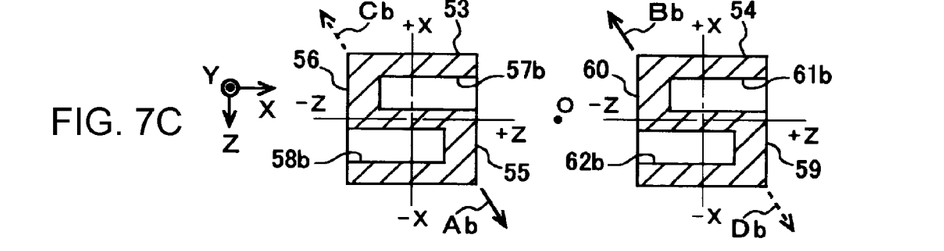
FIG. 7C is a sectional view taken along the line VIIC-VIIC of FIG. 7A.

Thus, as shown in FIGS. 7B and 7C, the base end-side portion and the tip end-side portion of each of both vibration arms 53 and 54 have an S-shaped cross-section which is point-symmetric with respect to a center O between both vibration arms. Therefore, if the flexural vibration piece 51 flexural-vibrates in reverse phase as described above, as indicated by arrows Aa and Ca of FIG. 7B, the base end-side portion of the vibration arm 53 tends to be bent from the cross-sectional center in the directions toward the −X and −Z region and the +X and +Z region having a greater mass. As indicated by arrows Ba and Da of FIG. 7B, the base end-side portion of the vibration arm 54 tends to be bent from the cross-sectional center in the directions toward the +X and +Z region and the −X and −Z region having a greater mass. Meanwhile, as indicated by arrows Ab and Cb of FIG. 7C, the tip end-side portion of the vibration arm 53 tends to be bent from the cross-sectional center in the directions toward the −X and +Z direction and the +X and −Z direction having a greater mass. As indicated by arrows Bb and Db of FIG. 7C, the tip end-side portion of the vibration arm 54 tends to be bent from the cross-sectional center in the directions toward the +X and −Z region and the −X and +Z region having a greater mass.

Thus, the base end-side portion and the tip end-side portion of each of the vibration arms 53 and 54 have the out-plane vibration components in the reverse direction to the Z direction. As a result, in the case of the vibration arms 53 and 54, the vibration components in the ±Z direction cancel each other as a whole, and the displacement in the ±Z direction is eliminated or suppressed. Therefore, in the case of the flexural vibration piece 51, the Q value can be improved, the CI value can be suppressed, and as a result, reduction in size and thickness can be realized.

Figure 8A:
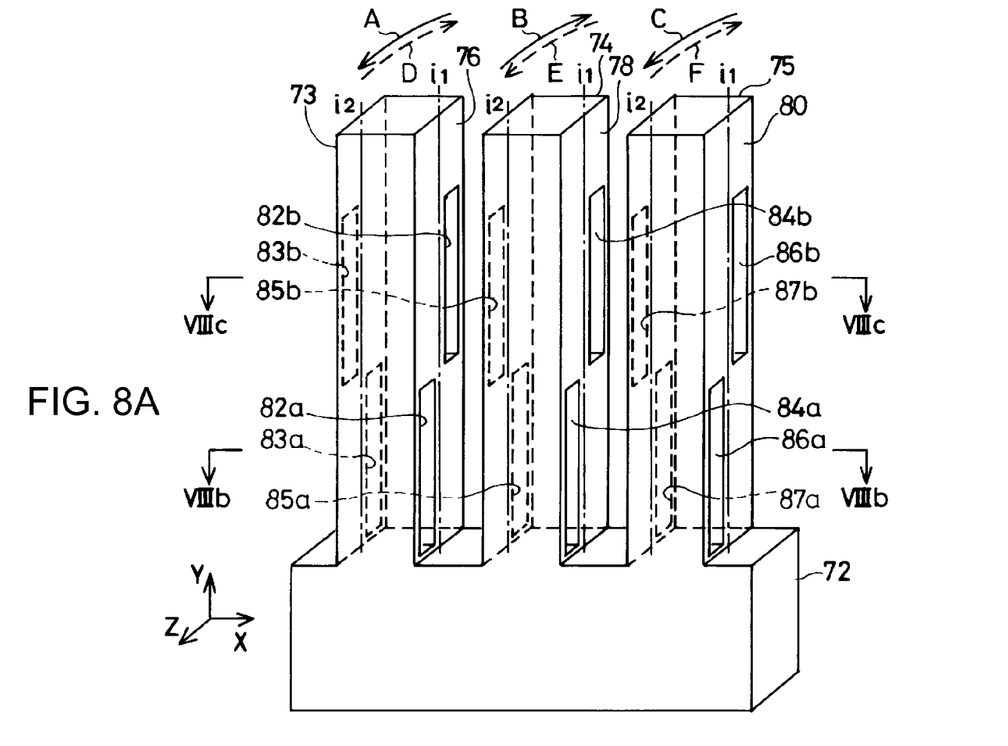
FIG. 8A is a schematic plan view of a flexural vibration piece according to an eighth embodiment of the invention.

FIG. 8A schematically shows a piezoelectric vibration piece according to an eighth embodiment of the invention. A flexural vibration piece 71 of this embodiment is a modification of the seventh embodiment, and have three vibration arms 73 to 75 extending in parallel from a base portion 72. As indicated by arrows A to F of FIG. 8A, the vibration arms 73 to 75 alternately vibrates in an inverse-phase flexural vibration mode in the vertical direction with respect to the surface of the vibration piece. The vibration arms 73 to 75 respectively have first main faces 76, 78, and 80 and second main faces 77, 79, and 81 which are arranged to be opposite each other in the width direction of the vibration arms.

Similarly to the seventh embodiment, first and second grooves are respectively formed at the first and second main faces of the vibration arms 73 to 75 so as to extend in the longitudinal direction from connection portions to the base portion. The first and second grooves of the vibration arm 73 on the left side of the drawing are respectively divided into two first groove portions 82a and 82b and second groove portions 83a and 83b which have the same width, length, and depth in the longitudinal direction. The first groove portions 82a and 82b and the second groove portions 83a and 83b are respectively arranged to be alternately shifted on both sides with respect to longitudinal center lines i1 and i2 of the vibration arm 73 in the longitudinal direction and on the opposite sides with respect to the longitudinal center lines i1 and i2.

Similarly, the first and second grooves of the vibration arm 74 at the center of the drawing are respectively divided into two first groove portions 84a and 84b and second groove portions 85a and 85b which have the same width, length, and depth in the longitudinal direction. The first groove portions 84a and 84b and the second groove portions 85a and 85b are respectively arranged to be alternately shifted on both sides with respect to longitudinal center lines i1 and i2 of the vibration arm 74 in the longitudinal direction and on the opposite sides with respect to the center lines.

The first and second grooves of the vibration arm 75 on the right side of the drawing are respectively divided into two first groove portions 86a and 86b and second groove portions 87a and 87b which have the same width, length, and depth in the longitudinal direction. The first groove portions 86a and 86b and the second groove portions 87a and 87b are respectively arranged to be alternately shifted on both sides with respect to longitudinal center lines i1 and i2 of the vibration arm 75 and on the opposite sides with respect to the center lines.

Figure 8B:
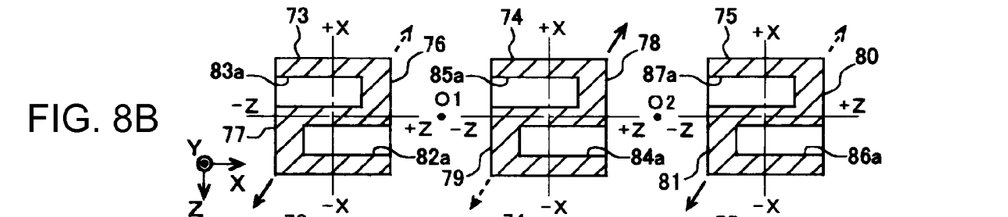
FIG. 8B is a sectional view of a vibration arm taken along the line VIIIB-VIIIB of FIG. 8A.
Figure 8C:
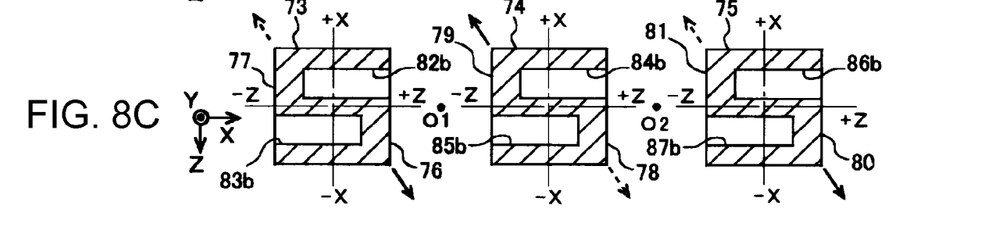
FIG. 8C is a sectional view taken along the line VIIIC-VIIIC of FIG. 8A.

Thus, as shown in FIGS. 8B and 8C, the base end-side portion and the tip end-side portion of each of the vibration arms 73 to 75 have an S-shaped cross-section which is point-symmetric with respect to a center O1 or O2 between the adjacent vibration arms. Therefore, if the flexural vibration piece 71 flexural-vibrates in inverse phase as described above, The base end-side portion of each of the vibration arms 73 to 75 tends to be bent from the cross-sectional center in the directions toward the −X and −Z region and the +X and +Z region having a greater mass. The tip end-side portion of each of the vibration arms tends to be bent from the cross-sectional center in the directions toward the −X and +Z region and the +X and −Z region having a greater mass.

Thus, the base end-side portion and the tip end-side portion of each of the vibration arms 73 to 75 have the out-plane vibration components in the reverse direction to the Z direction. As a result, in the case of the vibration arms 73 to 75, the vibration components in the ±Z direction cancel each other as a whole, and the displacement in the ±Z direction is eliminated or suppressed. Therefore, in the case of the flexural vibration piece 71, the Q value can be improved, the CI value can be suppressed, and as a result, reduction in size and thickness can be realized.

In another embodiment, the flexural vibration pieces 51 and 71 of FIGS. 7A to 7C and FIGS. 8A to 8C may have the vibration arms having the same configuration as that in each of the second to fourth embodiments. In yet another embodiment, like the tuning-fork type flexural vibration piece of FIGS. 5A to 5C, the first and second groove portions at the base end and the first and second groove portion at the tip end may be arranged at the reverse positions with respect to the longitudinal center line of the vibration arm between the vibration arms.

The invention is not limited to the foregoing embodiments, and various modifications or changes may be made without departing from the technical scope of the invention. For example, the depths of the first and second groove portions may vary in the longitudinal direction of the vibration arm insofar as the displacement in the ±Z direction can be eliminated or suppressed over the entire vibration arm.

The entire disclosure of Japanese Patent Application No. 2009-111256, filed Apr. 30, 2009 is expressly incorporated by reference herein.

What is claimed is:

1. A flexural vibration piece comprising:
   a base portion; and
   a vibration arm extending from the base portion,
   wherein the vibration arm has first and second main faces which are arranged to be opposite each other,
   the first main face have first groove which is formed in the longitudinal direction of the vibration arm,
   the second main face have second groove which is formed in the longitudinal direction of the vibration arm,
   the vibration arm further has a longitudinal center line which extends in the longitudinal direction of the vibration arm,
   the first groove has a plurality of first groove portions which are arranged on both sides with respect to the longitudinal center line, the plurality of first groove portions being shifted from each other in the longitudinal direction of the vibration arm,
   the second groove has a plurality of second groove portions which are arranged on both sides with respect to the longitudinal center line, the plurality of second groove portions being shifted from each other in the longitudinal direction of the vibration arm and being arranged on an opposite side to the first groove portions with respect to the longitudinal center line.

2. The flexural vibration piece according to claim 1, wherein the plurality of first groove portions and second groove portions have different widths in the longitudinal direction of the vibration arm, and the width of each of the first and second groove portions at a base end-side portion of the vibration arm is greater than the width of each of the first and second groove portions at a tip end-side portion of the vibration arm.

3. The flexural vibration piece according to claim 1, wherein the plurality of first groove portions and second groove portions have different lengths in the longitudinal direction of the vibration arm, and the length of each of the first and second groove portions at a base end-side portion of the vibration arm is smaller than the length of each of the first and second groove portions at a tip end-side portion of the vibration arm.

4. The flexural vibration piece according to claim 1, wherein a plurality of vibration arms extend in parallel from the base portion and flexural-vibrate to approach or move away from each other.

5. The flexural vibration piece according to claim 1, wherein the flexural vibration piece is a tuning-fork type vibration piece having two vibration arms.

6. The flexural vibration piece according to claim 1, wherein a plurality of vibration arms extend in parallel from the base portion and vibrate in a flexural mode in phases inverse to each other.

* * * * *